United States Patent [19]

Piosenka

[11] 4,395,703
[45] Jul. 26, 1983

[54] PRECISION DIGITAL RANDOM DATA GENERATOR

[75] Inventor: Gerald V. Piosenka, Scottsdale, Ariz.

[73] Assignee: Motorola Inc., Schaumburg, Ill.

[21] Appl. No.: 278,261

[22] Filed: Jun. 29, 1981

[51] Int. Cl.³ .......................................... H03K 13/02
[52] U.S. Cl. ............................ 340/347 AD; 364/717; 331/78
[58] Field of Search .................. 340/347 CC, 347 AD; 331/78; 364/717; 375/34; 328/14, 158

[56] References Cited

U.S. PATENT DOCUMENTS

| 3,427,478 | 2/1969 | Etter | 340/347 CC |
|---|---|---|---|
| 3,456,208 | 7/1969 | Ratz | 340/347 CC |
| 3,492,587 | 1/1970 | Hutton | 340/347 CC |
| 3,516,022 | 6/1970 | Brolin | 375/34 |
| 3,671,871 | 6/1972 | Malm | 328/14 |
| 3,879,724 | 4/1975 | McDonald | 328/158 |
| 4,151,404 | 4/1979 | Harrington | 340/347 CC |
| 4,151,516 | 4/1979 | O'Neill | 340/347 CC |
| 4,176,399 | 11/1979 | Hoffmann | 340/347 CC |
| 4,202,051 | 5/1980 | Davida | 340/347 CC |

*Primary Examiner*—C. D. Miller
*Attorney, Agent, or Firm*—Eugene A. Parsons

[57] ABSTRACT

A precision digital random data generator comprising a matched pair of D-type flip-flops, a differential amplifier for comparing integrated outputs of the flip-flops, provisions for a noisy analog input of the general type (n)t feeding one input of the comparator with the output of the comparator feeding a D input of one of the D type flip-flops which generates an output which statistically correlates with the analog input and is also fed to the other input of the comparator.

4 Claims, 2 Drawing Figures

PRECISION DIGITAL RANDOM DATA GENERATOR

FIELD OF THE INVENTION

The invention relates to an electronic apparatus which greatly reduces the statistical bias which is generally encountered when low level random noise signals are amplified and used as digital signals.

BACKGROUND OF THE INVENTION

Prior art apparatus for amplification and synchronization of random noise signals, for ultimate use in digital systems, typically create signal distortion and statistical biases which tend to destroy the usefulness of the processed noise signal. The analog noise input signal may be on the order of 10–20 millivolts whereas useful digital signals are generally in the range of about 5 volts and are generally required to be synchronized with the digital system. The statistical characteristics of the digital noise signal must correlate with the random statistics of the analog input signal.

SUMMARY OF THE INVENTION

The system of the invention facilitates the generation of statistically precise random synchronous digital data with relatively simple circuits which do not require timing or adjustment. This is accomplished by means of low cost readily available integrated circuits. Advantage is taken of monolithic circuits which have useful matched operational characteristics, thus avoiding or minimizing bias errors.

It is, therefore, an object of the invention to provide a synchronous digital random data signal which is derived from an analog random noise signal and which is essentially free of probability bias.

It is another object of the invention to provide a statistically pure random digital data signal without need for tuning or adjustment of the circuit of the invention.

Prior art problems and the objects of the invention are met by means of a very simple, low cost circuit employing a differential amplifier and a pair of matched flip-flops in a circuit relying on negative feedback characteristics for enhanced stability.

The objects of the invention and other advantages and aspects thereof will be more readily understood upon consideration of the Detailed Description of the Invention, infra, taken together with the drawings in which.

DETAILED DESCRIPTION OF THE INVENTION

Figure 1:
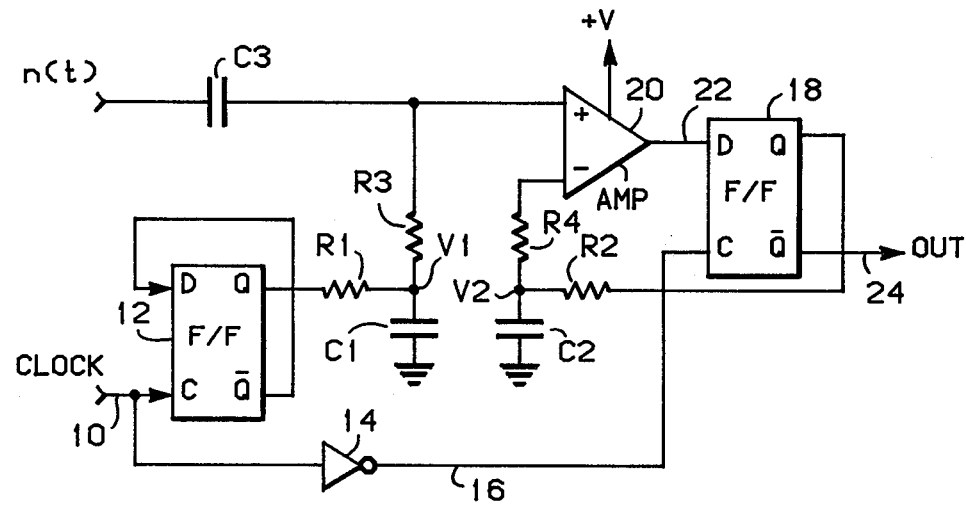
FIG. 1 is a schematic diagram of the circuit of the invention.

Referring first to FIG. 1, it will be seen that a system clock is inputted at terminal 10. This clock signal is applied to the clock input of flip-flop 12, and to an input of inverter 14. The output of inverter 14, on line 16, is applied to the clock input of flip-flop 18. The $\overline{Q}$ output of flip-flop 12 is applied back to the input at D. The Q output of flip-flop 12 is applied through resistor R1 to the junction of capacitor C1 and resistor R3. The other end of capacitor C1 is connected to ground. The other end of resistor R3 is connected to the positive input of amplifier 20. A noise input, n(t), is applied through capacitor C3 to the positive input of amplifier 20. Amplifier 20 may be a differential amplifier. Output 22 of amplifier 20 is applied to the D input of flip-flop 18. The Q output of flip-flop 18 is applied through resistor R2 to the junction of capacitor C2 and resistor R4. The other end of capacitor C2 is connected to ground. The other end of resistor R4 is connected to the negative input of amplifier 20. The Q output of flip-flop 18 is the output of the system 24. This completes the description of the electrical connections of FIG. 1.

Figure 2:
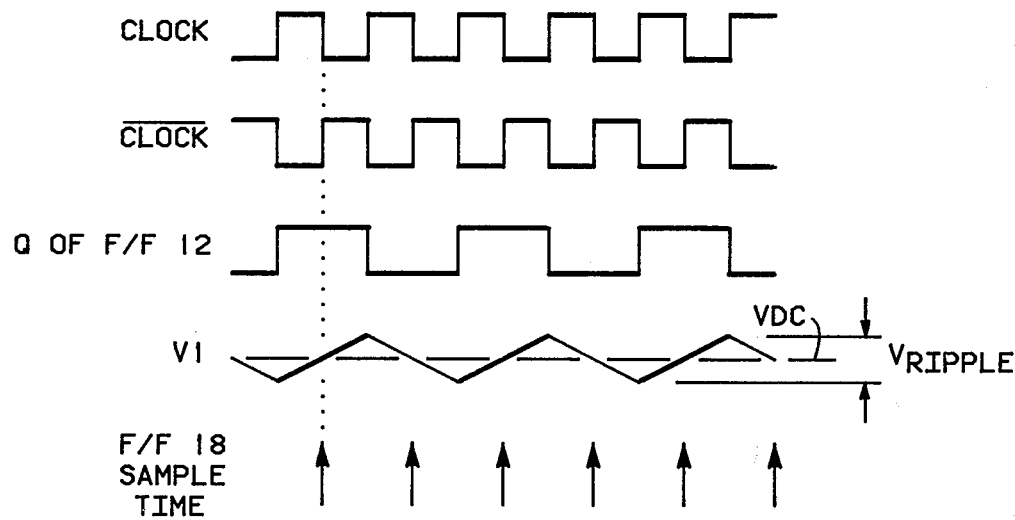
FIG. 2 is illustrative of waveform timing diagrams which may be found in the circuit of FIG. 1.

In operation a symmetrical clock signal is applied to terminal 10 of the circuit of FIG. 1. This clock signal is shown in FIG. 2 as "clock". This signal is inverted through inverter 14 and the signal on line 16 is "$\overline{\text{clock}}$", also shown in FIG. 2. It will be clear that $\overline{\text{clock}}$ is the complement of clock. Because flip-flop 12 is a D type flip-flop with its $\overline{Q}$ output connected to its D input flip-flop 12 has the characteristic of dividing the input signal by two. Therefore it may be readily understood that the Q output of flip-flop 12 is a square wave having half the frequency of the input clock frequency. This signal is applied through R1 and C1 to ground and the resulting signal at V1, the junction of R1 and C1, is an integrated signal as shown on FIG. 2. This slowly changing linear triangular signal is applied through resistor R3 to the positive input of amplifier 20. Resistor R3 serves to isolate the R1, C1 network from the positive input of amplifier 20. A noise signal n(t) is applied through coupling capacitor C3 to the junction of resistor R3 and the positive input of amplifier 20. V1, therefore, provides a bias voltage which slowly varies in a triangular fashion for the input signal n(t). The inverted clock signal $\overline{\text{clock}}$ applied to the clock input of flip-flop 18 from inverter 14 on line 16 provides a complementary clock for flip-flop 18. When the D input of flip-flop 18 is high, the Q output will go high on the following negative to positive transition of the input clock signal. If the D input is low, the Q output will go low on the following negative to positive transition of the clock signal. Since the negative to positive transitions of the input clock signal to flip-flop 18 are 180° out of phase with the clock signals to flip-flop 12, it will be noted, see FIG. 2, that the sample times for flip-flop 18 are at the null voltages of V1 coming out of flip-flop 12 and integrated by resistor R1 and capacitor C1. Therefore the ripple effect of the signal at V1 is minimized at the positive input of differential amplifier 20. Therefore if the DC levels of the inputs to differential amplifier 20 are equal, the signal n(t) applied through capacitor C3 to the positive input of differential amplifier 20 will result in an amplified version of the same signal at output 22, that is; a statistical analysis of the number of positive and negative going signals at the positive input of differential amplifier 20 and at output 22 of differential amplifier 20 will be the same. If however, the DC inputs are unbalanced, the output at terminal 22 of differential amplifier 20 will be biased in that it will demonstrate either more positive going signals or more negative going signals depending on the direction of the unbalance. This situation will be automatically corrected by the circuit of FIG. 1 in that positive signals in excess of fifty percent applied to flip-flop 18 input D will be present at the Q output and integrated by resistor R2 and capacitor C2 so as to increase the voltage through R4 to the negative input of differential amplifier 20 and thereby return the system to DC balance conditions. It will be understood that the time constant of R1 and C1 and the time constant of R2 and C2 are long compared to the applied signals thereby generating linear triangular signals at V1 and V2. This means that the voltage applied to both inputs of differential amplifier 20 vary slowly with respect to clock time and are of consequence only at the time that V1 crosses the line VDC, see FIG. 2. The digital output string on $\bar{Q}$, terminal 24 of flip-flop 18, automatically has the same statistical variation as the n(t) input to the circuit.

The effectivity of the circuit is enhanced still further if flip-flop 12 and flip-flop 18 are matched flip-flops. This may be readily accomplished by providing both flip-flops on a single monolithic chip thereby providing the same temperature changes and electrical characteristics in both cases. To the degree to which flip-flops 12 and 18 are matched, the level of the DC component at V1 is also representative of the level of the DC components of any signal at the output of flip-flop 18 which has a statistical monobit balance of fifty percent. The difference in the levels of the DC components of the waveforms at the Q output of flip-flop 12 and the Q output of flip-flop 18 is proportional to the difference in the monobit balance between the two waveforms. This difference is applied to differential amplifier 20 in such a manner as to reduce the monaticity balance error by a factor proportional to the inverse of the amplifier gain. With the amplifier balanced as described, above, the output waveform represents a limited version of the input signal sampled at the negative transition of the input clock. Output statistical parameters thus reflect the statistical characteristics of the input as modified by the sampling process.

It will be understood that resistor R1 and capacitor C1 form a low pass filter. The filter time constant is selected to be large in comparison with the period of the input clock. The voltage at node V1 is a DC level representative of a waveform from flip-flop 12 having a fifty percent duty cycle. A small triangular ripple is also present superimposed on the DC level. Resistor R3 couples this level to the positive input of differential amplifier 20 and isolates n(t) from capacitor C1. Resistor R2, capacitor C2 and resistor R4 perform analagously for the Q signal from flip-flop 18 and amplifier 20's negative input. The DC component of the differential input voltage $$(V_{in}+)-(V_{in}-)$$

is proportional to the difference in monobit balance between digital signals Q from flip-flop 12 and from flip-flop 18. The hard limited amplifier output serves as the D input to flip-flop 18. This input is sampled at the falling edge of the input clock to produce the next Q output. Thus, an increase in the number of logic "1" levels generated at Q of flip-flop 18 increases the potential at the negative input of differential amplifier 20. The resulting differential input thus causes differential amplifier 20 to produce more logic "0" levels to correct the imbalance. Thus the differential inputs of amplifier 20 are maintained balanced. Noise input n(t) thus controls the output of differential amplifier 20 on line 22. This output is then sampled by the clock at flip-flop 18 to produce the desired random output.

It will be understood that resistors R1, R2, R3, and R4 may be replaced by inductive devices where high frequency operation is required.

The invention facilitates the generation of statistically precise random synchronous digital data with a minimum amount of circuitry and without the need of complex alignment adjusting or tuning procedures. The design features wide tolerance to power supply level and immunity to power supply correlatable signal corruption. The design requires no high accuracy components and features inherent immunity to thermal effects.

While the invention has been particularly shown and described with reference to a preferred embodiment thereof it will be understood by those skilled in the art that various other modifications and changes may be made to the present invention from the principles of the invention described above without departing from the spirit and scope thereof as encompassed in the accompanying claims. Therefore it is intended in the appended claims to cover all such equivalent variations as come within the scope of the invention as described.

What is claimed is:

1. An electronic circuit for amplifying and synchronizing a random analog input noise signal having a statistical characteristic to produce a useful random data digital signal, the digital signal having statistical characteristics essentially the same as the characteristics of the random analog signal, the circuit comprising:

a system clock signal input;

first integrator means connected to said input for generating a first integrated signal from a system clock signal applied to said input;

a second integrator means connected to said input for generating a second integrated signal utilizing the system clock signal and for generating the random data digital signal at an output thereof;

both integrator means being clocked at the same rate;

means for comparing said first and second integrated signals and for generating an output of said comparing means responsive to said comparison, said output of said comparing means being a second input of said second bias means; and means for applying a time varying noise signal in superposition with said first integrated signal.

2. The electronic circuit according to claim 1 wherein at least one of said first and second integrator means further comprises:

a low pass filter.

3. The electronic circuit according to claim 2 wherein at least one of said first and second integrator means further comprises:

a flip-flop.

4. The electronic circuit according to claim 1, 2 or 3 wherein at least an active portion of each of said first and second integrator means comprises a single monolithic circuit and wherein said active portions are on a single monolithic semiconductor chip.

* * * * *